United States Patent
Nakai et al.

(10) Patent No.: US 8,524,001 B2
(45) Date of Patent: Sep. 3, 2013

(54) SILICON WAFER AND METHOD FOR PRODUCING THE SAME

(75) Inventors: Katsuhiko Nakai, Yamaguchi (JP); Atsushi Ikari, Yamaguchi (JP); Masamichi Ohkubo, Yamaguchi (JP)

(73) Assignee: Siltronic AG, Munich (DE)

( * ) Notice: Subject to any disclaimer, the term of this patent is extended or adjusted under 35 U.S.C. 154(b) by 896 days.

(21) Appl. No.: 12/653,651

(22) Filed: Dec. 16, 2009

(65) Prior Publication Data

US 2010/0164071 A1 Jul. 1, 2010

(30) Foreign Application Priority Data

Dec. 26, 2008 (JP) ................................ 2008-334755
Aug. 25, 2009 (JP) ................................ 2009-194085

(51) Int. Cl.
*C30B 15/02* (2006.01)
(52) U.S. Cl.
USPC ................ 117/13; 117/16; 117/18; 117/20
(58) Field of Classification Search
USPC ........................................ 117/13, 16, 18, 20
See application file for complete search history.

(56) References Cited

U.S. PATENT DOCUMENTS

| 6,599,360 | B2 * | 7/2003 | Iida et al. | 117/19 |
| 6,800,132 | B1 * | 10/2004 | Komiya et al. | 117/13 |
| 2002/0121238 | A1 | 9/2002 | Falster et al. | |
| 2003/0015131 | A1 * | 1/2003 | Iida et al. | 117/14 |
| 2003/0079674 | A1 * | 5/2003 | Tachikawa et al. | 117/30 |
| 2004/0192071 | A1 * | 9/2004 | Kobayashi et al. | 438/795 |
| 2008/0225640 | A1 * | 9/2008 | Akbar et al. | 367/25 |

FOREIGN PATENT DOCUMENTS

| JP | 03255114 | 11/1991 |
| JP | 2001151596 A | 6/2001 |
| JP | 2004-282088 A | 10/2004 |
| JP | 2006312576 A | 11/2006 |
| JP | 2007-254274 A | 10/2007 |

OTHER PUBLICATIONS

V.V. Voronkov, The Mechanism of Swirl Defects Formation In Silicon, Journal of Crystal Growth 59 (1982), 625-643.
Werner Zulehner, Diethart Huber, Czochralski-Grown Silicon, Crystal Growth, Properties and Applications, Springer-Verlag, New York, 1982, 26-29.

* cited by examiner

*Primary Examiner* — Bob M Kunemund
(74) *Attorney, Agent, or Firm* — Brooks Kushman P.C.

(57) ABSTRACT

Silicon wafers having excellent voltage resistance characteristics of an oxide film and high C-mode characteristics are derived from single crystal silicon ingots doped with nitrogen and hydrogen, characterized in that a plurality of voids constituting a bubble-like void aggregates are present $\geq 50\%$ relative to total voids; a V1 region having a void density of over $2\times10^4/cm^3$ and below $1\times10^5/cm^3$ is $\leq 20\%$ of the total area of wafer; a V2 region having a void density of $5\times10^2$ to $2\times10^4/cm^3$ occupies $\geq 80\%$ of the total area of the wafer; and bulk microdefect density is $\geq 5\times10^8/cm^3$.

3 Claims, 6 Drawing Sheets

SILICON WAFER AND METHOD FOR PRODUCING THE SAME

CROSS-REFERENCE TO RELATED APPLICATIONS

This application claims priority to Japanese Patent Application Nos. 2008-334755 filed Dec. 26, 2008 and 2009-194085 filed Aug. 25, 2009 which are herein incorporated by reference.

BACKGROUND OF THE INVENTION

1. Field of the Invention

The present invention relates to a silicon wafer and a method for producing the same. More specifically, the present invention relates to a silicon wafer (mirror surface wafer) obtained by doping nitrogen and hydrogen, and polishing (mirror fabrication) having a void region, and a method for producing the same.

2. Background Art

A silicon wafer used as a substrate for semiconductor integrated circuits (a semiconductor device) is cut from a silicon crystal, and the most widely adopted method for producing this single crystal is growth by the Czochralski method (hereafter referred to also the "CZ method"). The CZ method is a method for growing a single crystal by contacting a seed crystal with molten silicon in a quartz crucible, and slowly withdrawing it, by means of which a large size single crystal with few defects and without dislocations has been produced.

The semiconductor device is commercially produced by pulling the single crystal by using the above CZ method, using a wafer obtained from this single crystal silicon (an as-grown wafer) as a substrate, and subjecting it to many processes for circuit formation. In such a wafer, grown-in defects generated by aggregation of point defects during crystal growth are present. Exposure of these defects at the wafer surface has raised a problem, due to deterioration of the characteristics of a device formed thereon.

In order to produce a wafer having decreased density or decreased size of such grow-in defects, various approaches have been tried. First, JP 3255114 has disclosed technology, wherein, in producing a silicon wafer, pulling speed is set within a predetermined range, and nitrogen concentration for doping during crystal pull is set to be equal to or higher than $1 \times 10^{14}$ atoms/cm$^3$.

In addition, JP-A-2006-312576 has disclosed technology, wherein, in producing a silicon crystal, nitrogen in the aforesaid single crystal is set to be $1 \times 10^{12}$ to $5 \times 10^{14}$ atoms/cm$^3$, and a hydrogen partial pressure in the gas atmosphere inside a growth apparatus is set to be 40 to 400 Pa. In addition, it has been disclosed also that defect regions are an oxidation-induced stacking fault (hereafter referred to also simply "OSF") region, a Pv region (a defect-free region with vacant holes predominant, so-called "vacancies") and a Pi region (a defect-free region with inter-lattice elements ("interstitials") predominant).

According to the production methods of JP 3255114 and JP-A-2006-312576, there exist no voids (holes) in the OSF region of a silicon crystal doped with nitrogen (which hereafter may be referred to simply as a "nitrogen doped crystal"). However, such an OSF region has a low index showing absence of a crystal defects, which deteriorates the voltage resistance characteristics of an oxide film, that is, C-mode (a true destruction region) characteristics (high C-mode pass rate). In addition, in such a nitrogen doped crystal, a region with relatively low void density (specifically, a region in the nitrogen doped crystal having a void density of over $1 \times 10^3$/cm$^3$ and equal to or lower than $5 \times 10^3$/cm$^3$), also has low C-mode characteristics. In conclusion, the nitrogen doped crystal obtained by JP 3255114 cannot be said to have high C-mode characteristics totally, and is inferior in voltage resistance characteristics of an oxide film. This means that voids or some kind of microdefects are present over all of the aforesaid nitrogen doped crystal, which renders the wafers unsuitable for use in fabricating semiconductor devices.

SUMMARY OF THE INVENTION

With this background, it is an object of the present invention to provide a silicon wafer composed of a silicon crystal displaying excellent voltage characteristics with respect to an oxidized film, and high C-mode characteristics (good in high C-mode pass rate). In addition, it is another object of the present invention to provide a method for producing the aforesaid silicon wafer. In view of the above problems, as a result of intensive studies carried out by the present inventors, it has been found that a silicon crystal (single crystal silicon) having excellent voltage resistance characteristics with respect to an oxidized film, and high C-mode characteristics (good in high C-mode pass rate) can be obtained by the addition of nitrogen and hydrogen in predetermined concentration, along with a "quenching" treatment carried out at predetermined temperature gradient in pulling-up the silicon crystal (hereafter referred to as "average temperature gradient in a crystal growth longitudinal direction" or simply "G"), and at predetermined pulling speed (hereafter referred to simply as "V"). It has been found that, by this treatment, a silicon crystal having improved voltage resistance characteristics with respect to an oxidized film, and improved C-mode characteristics, can be obtained.

DETAILED DESCRIPTION OF THE PREFERRED EMBODIMENT(S)

Here, explanation will be given on characteristics of "quenching" in the present invention. Conventionally, an operation of quenching of the silicon crystal has been carried out in view of enhancing productivity. However, in conventional quenching treatment, it is usual to increase both the temperature gradient and pulling speed. On the other hand, the present inventors have found, as a result of trial and error, that in "quenching", by limiting the temperature gradient to a very narrow predetermined range, while maintaining pulling speed at a similar level to that in a conventional method, the void density is made significantly small, and void aggregates are present in a bubble-like shape, which does not detrimentally influence the semiconductor device.

That is, the present invention for attaining the above objects relates to a silicon wafer having nitrogen and hydrogen, characterized in that: a plurality of voids constituting a bubble-like void aggregate are present, in an amount $\geq 50\%$ relative to total number of voids; a V1 region having a void density of over $2\times10^4/cm^3$ and below $1\times10^5/cm^3$ occupies $\leq 20\%$ of the total area of the silicon wafer; a V2 region having a void density of $5\times10^2$ to $2\times10^4/cm^3$ occupies $\geq 80\%$ of the total area of the silicon wafer; and the bulk microdefect density of the wafer is $\geq 5\times10^8/cm^3$.

In addition, a method for producing the silicon wafer of the present invention for attaining the above objects, is characterized by obtaining a silicon wafer by slicing from a pulled silicon crystal; by setting the nitrogen concentration in the silicon crystal to be $3\times10^{13}$ to $3\times10^{15}$ atoms/cm$^3$; by setting the pressure inside a crystal pulling furnace to be 40 to 250 mbar; by introducing hydrogen of 1 to 3.8% by volume into the furnace atmosphere; by setting a temperature gradient in a longitudinal direction of the silicon crystal at 1100 to 1200° C. during pulling the silicon crystal to be $\geq$ than 3.5° C./mm; and by controlling a V1 region having a void density of over $2\times10^4/cm^3$ and below $1\times10^5/cm^3$ so as to be 20% of the total area of the silicon wafer, as the upper limit value of crystal pulling speed, and a V2 region having a void density of $5\times10^2$ to $2\times10^4/cm^3$ to be 80% of total area of said silicon wafer, as the lower limit value of crystal pulling speed.

According to the present invention, a high quality silicon wafer (mirror surface wafer) can be obtained, which is composed of a silicon crystal having excellent voltage withstanding characteristics with respect to an oxidized film, and high C-mode characteristics (good in high C-mode pass rate), which can be used suitably as the semiconductor device. In addition, pulling speed of the silicon crystal can be increased further, and thus productivity can be enhanced as well.

Explanation will be given below on preferred embodiments applying the present invention, with reference to accompanying drawings. It should be noted that the drawings are schematic ones to assist an understanding of the present invention, therefore proportions of dimension and shape along with configuration are drawn with exaggeration. Therefore, the drawings are different from practical ones.

A first embodiment of the present invention relates to a silicon wafer doped with nitrogen and hydrogen, characterized in that the wafer has a plurality of voids constituting bubble-like void aggregates in an amount$\geq 50\%$, relative to total void number; a V1 region, having a void density of over $2\times10^4/cm^3$ and below $1\times10^5/cm^3$ which occupies $\leq 20\%$ of the total area of the silicon wafer; a V2 region, having a void density of $5\times10^2$ to $2\times10^4/cm^3$, which occupies $\geq 80\%$ of the total area of the silicon wafer; and a bulk micro defect density is $\geq 5\times10^8/cm^3$.

The silicon wafer relevant to the present embodiment has technological significance in a point that nitrogen and hydrogen are both contained; having a bulk microdefect density to a degree required for gettering in a device process (hereafter referred to as "BMD value"); along with a density and shape of the void, and formation of an aggregate; as a non-separable single body. Explanation will be given below in detail on each of the conditions (requirements).

Figure 1:
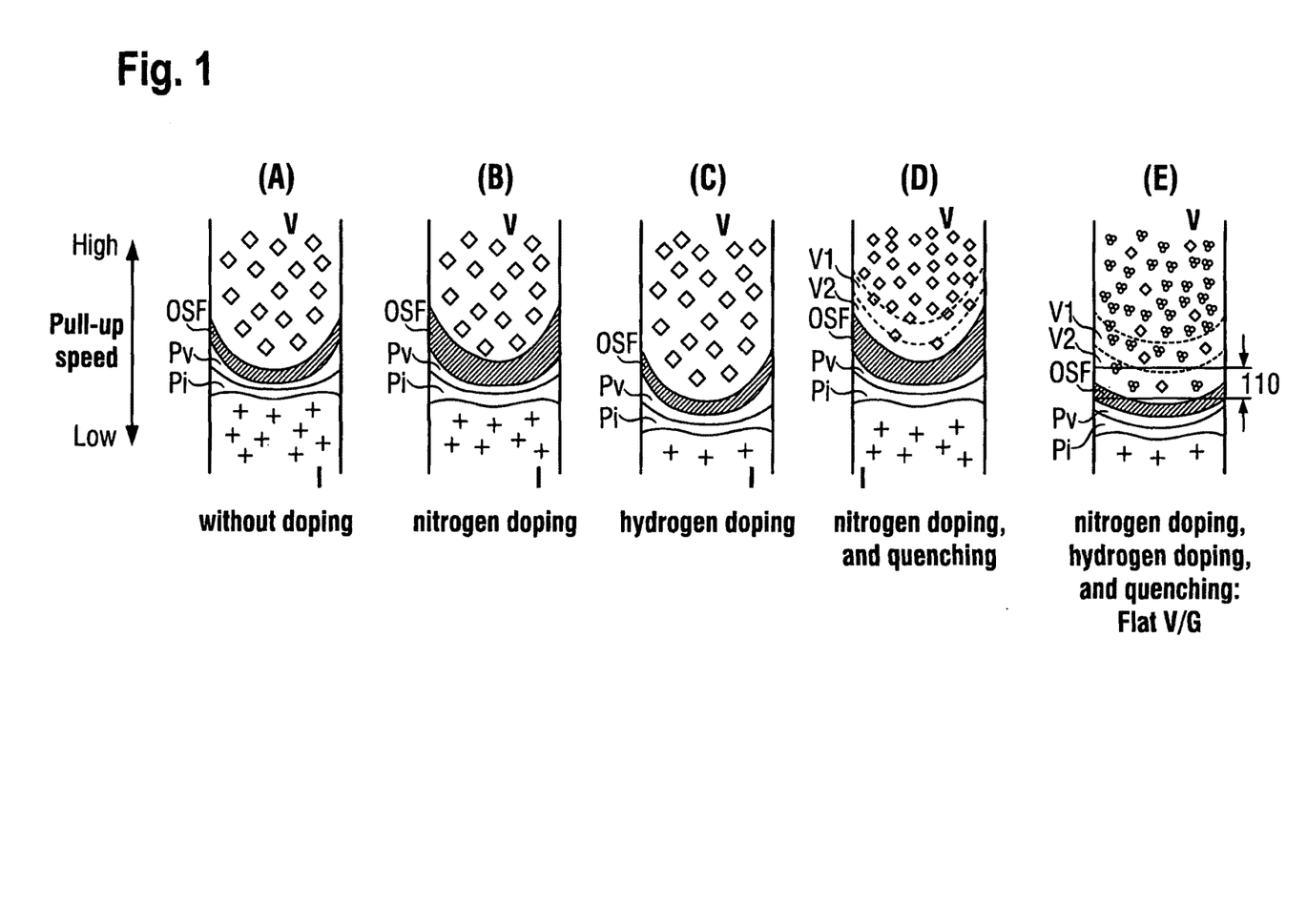
FIG. 1 is a cross-sectional view of a silicon crystal, schematically showing the influence of carrying out the doping treatment of nitrogen and hydrogen, along with the quenching treatment, according to a first embodiment of the present invention, on generation of crystal defects.

FIG. 1 is a cross-sectional view (phase diagram) of a silicon crystal, schematically showing the influence of doping treatment with nitrogen and hydrogen, along with "quenching" treatment, according to the present embodiment, on generation of crystal defects (explanation will be given later on "quenching" treatment). In more detail, a silicon crystal shown in FIG. 1 is expressed to have the higher crystal pulling speed at the more upward position, when viewed by a longitudinal direction. In addition, in FIG. 1, [A] represents the case without doping, [B] the case with nitrogen doping only, [C] the case with hydrogen doping only, [D] the case with nitrogen doping and with "quenching" treatment, and [E] the case with nitrogen doping and hydrogen doping, along with "quenching" treatment. Any of [A] to [E] of FIG. 1 has a V region having voids (a region with many hollow areas generated from a deficit of a silicon atom, that is, "vacancies"), an OSF region (a stack fault region generated by an inter-lattice silicon converted to silicon oxide in oxidation), a Pv region, a Pi region, and an I region (a region with many transitions generated by the presence of excess silicon atoms, or an agglomerate of excess silicon atoms). [A] to [D] and [E] of FIG. 1 differ in a void shape, and also [D] and [E] in FIG. 1 have characteristics of having special V1 region and V2 region as a part of the V region. Presence or absence of each treatment in [A] to [E] is summarized in the following Table 1.

TABLE 1

|  | [A] | [B] | [C] | [D] | [E] |
|---|---|---|---|---|---|
| Nitrogen doping | No | Yes | No | Yes | Yes |
| Hydrogen doping | No | No | Yes | No | Yes |
| Quenching treatment | No | No | No | Yes | Yes |
| Remark |  |  |  |  | flat V/G |

Figure 2:
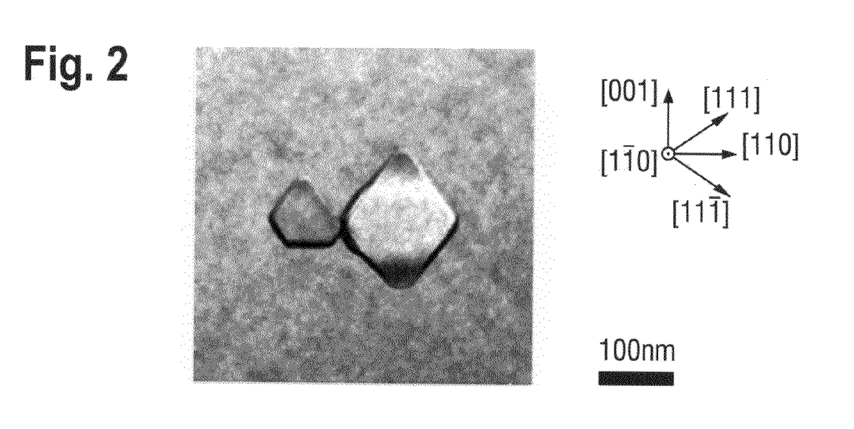
FIG. 2 is a transmission electron microscope photo, showing an octahedron-like void aggregate, which are present in a conventional silicon wafer.

First, it has been clarified that the shape of voids present in the V region of a conventional silicon crystal is, as shown in FIG. 2, is an octahedron (9) having a {111} plane. In a silicon crystal with a crystal size of equal to or larger than 200 mm, produced by the Czochralski method, the size of the octahedron void is about 100 to 300 nm. Such an octahedron-like void may largely give rise to a decrease in device performance, in particular, voltage resistance characteristics of the oxide film.

On the other hand, in the silicon wafer relevant to the present embodiment, a bubble-like void aggregate constituted by a plurality of smaller voids is present, and the number of voids contained in such bubble-like void aggregates is present in $\geq$ to 50% relative to the total void number (refer to (E) of FIG. 1). Here, the above "total void number" represents total number of voids contained in the bubble-like void aggregate, and voids not contained therein.

The present inventors have observed the silicon crystal (silicon wafer) with a transmission electron microscope (TEM, JEM-2010, manufactured by JEOL, Ltd.), as a result of intensive studies. Observation direction was a 110 direction, and diffraction condition was set to a two-wave condition, where 220 reflection is excited. By setting mismatching amount S from the Bragg condition to be larger than 1 g, the above bubble-like void aggregate was discovered, and it has been found that such bubble-like void aggregates significantly enhance high C-mode characteristics, as compared with the conventional octahedron-like voids. Explanation will be given below on the bubble-like void aggregate.

Figure 3:
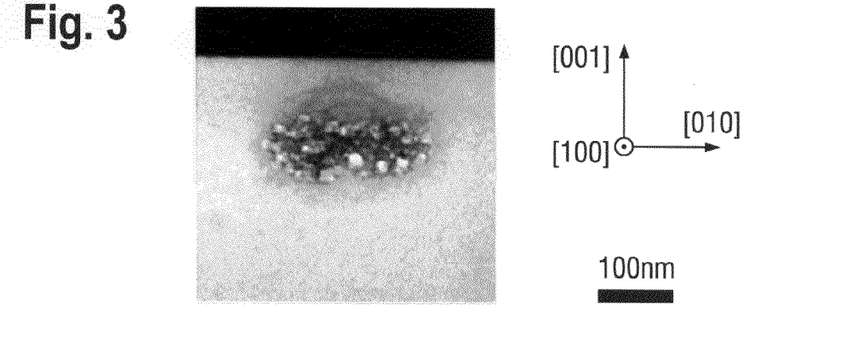
FIG. 3 is a transmission electron microscope photo, showing a bubble-like void aggregate present in a silicon wafer relevant to a first embodiment of the present invention.

FIG. 3 is a transmission electron microscope photo, showing a bubble-like void aggregate, present in a silicon crystal in the present embodiment. The bubble-like shape looks like what is called a "bubble", hence the name, as shown in FIG. 3, when a plurality of irregular voids not having the {111} plane, and not being a regular octahedron, are assembled. Therefore, the aggregate of voids, which are peculiarly observed in the silicon wafers (and silicon crystal) is called a "the bubble-like void aggregate". In the case of a silicon wafer having such a void configuration, as will be described later, the void has little adverse influence on a device. The bubble-like void aggregate in the present embodiment can be said a considerably "harmless" void, as a result.

Figure 4:
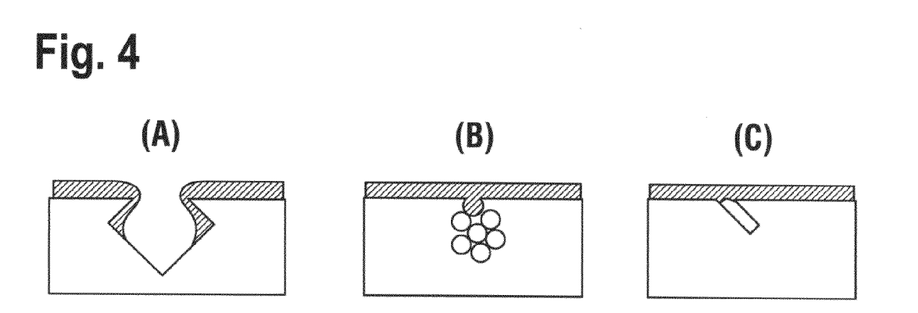
FIG. 4 is a drawing schematically showing the influence of an octahedron-like void and a bubble-like void on oxidized film formation.

The mechanism by which the bubble-like voids fail to decrease voltage resistance characteristics of the oxide film is speculated as follows. FIG. 4 is schematic cross-sectional views showing states where oxidized films are formed on voids exposed at the wafer surfaces. First, (A) shows the case of the octahedral void, and (B) shows the case of the bubble-like void aggregate. In the case of the octahedral void, the void is never completely covered by the oxidized film, providing a state of incomplete formation of the oxidized film. In such an oxidized film, voltage resistance characteristics (breakthrough) is easily deteriorated. On the other hand, in the case where the bubble-like void aggregate is exposed at the surface, it is completely covered by the oxidized film, because size of each void constituting the bubble-like void aggregate is small. As a result, voltage resistance characteristics of the oxidized film is not so easily deteriorated. On the other hand, voids in silicon crystals doped with only nitrogen have been known to be plate-like or bar-like (refer to JP-A-2001-151596). In the case of such a void, the void is never completely covered by the oxidized film as shown in (C), and thus the voltage resistance characteristics of the device is sharply reduced similarly as in the above (A).

From the above, in the case where voids form the bubble-like void aggregate, and size of each void constituting the bubble-like void aggregate is small and is an irregular form of almost a sphere, impairment of voltage resistance characteristics of the oxidized film is difficult. It should be noted that "an irregular form of almost a sphere" in the present description means a shape having ratio A/B (aspect ratio) is equal to or smaller than 2, wherein A is maximal diameter and B is diameter in a perpendicular direction to a direction where A is obtained, in measurement of the size by observing the void from a certain observation surface. In the case where the aspect ratio is over 2, as shown in FIG. 4(C), the void is never completely covered by the oxidized film, therefore voltage resistance characteristics are easily decreased.

The size of the irregular void constituting the aggregate 10 is preferably equal to or smaller than 50 nm, and more preferably equal to or smaller than 30 nm. The number of the voids constituting the aggregate is not especially limited as long as it is plural. However, it is preferably $\geq 5$, more preferably $\geq 10$, and still more preferably, 20 to 100. The void size within the above range still more enhances the degree of making the aggregate "harmless". In particular, in the case where the number of the voids constituting the aggregate is equal to or more than 5, identification of the aggregate 10 with TEM (to be described later) is easier. That is, in all of the cases where a microscope is used in observing the voids (observation) in the present description, TEM can be used, although there is some limitation on resolution.

In addition, it is preferable that the aggregate is present in an amount $\geq 75\%$ of the total voids (voids with any kind of shape, including bubble-like shape or the octahedron-like shape), and it is more preferable to be present in an amount of $\geq 90\%$ of total voids. Bubble aggregates within the above range are capable of more greatly enhancing the "harmless" nature of the aggregates.

Next, description will be given on the relationship between the ratio of the bubble-like void aggregates and voltage resistance characteristics of the oxidized film. As described above, the bubble-like void aggregate makes it more difficult to lower the voltage resistance characteristics of the oxidized film. Therefore, by increasing the ratio of the bubble-like void aggregates which are "harmless" to the total void number, voltage resistance characteristics of the oxidized film can be improved. By setting the ratio of the bubble-like void aggregate at $\geq 50\%$, a high C-mode pass rate of the V1 region having a void density of over $2\times10^4/cm^3$ and below $1\times10^5/cm^3$, becomes 20 to 40%, and the high C-mode pass rate of the V2 region having a void density of $5\times10^2$ to $2\times10^4/cm^3$ becomes 70 to 100%. In the case where the bubble-like void aggregate is absent, the V1 region and V2 region both provide the high C-mode pass rate of 20 to 40%.

In the present description, a defect (void) region was evaluated (identified) by the following method. In-plane distribution of voids in the silicon wafer is measured by using an LSTD scanner (MO-6), manufactured by Raytex Co., which is a commercial defect evaluation apparatus. This MO-6 scanner visible light laser from a brewster's angle, and detects a scattered image of p-polarized light as a defect image, with a camera arranged in a vertical direction. Because the laser penetrates only down to 5 μm from the substrate surface, a defect present at a depth of down to 5 μm from the substrate surface can be measured. In this measurement, voids with a size of equal to or larger than 50 nm, as converted to a sphere, can be measured, by adjustment of detection sensitivity. Volume density of the voids is calculated from area density of the voids measured, and measurement depth of 5 μm. In addition, a region having the void density of over $2\times10^4/cm^3$ and below $1\times10^5/cm^3$, is defined as the V1 region, and a region having the void density of $5\times10^2$ to $2\times10^4/cm^3$, is defined as the V2 region.

In addition, in the present description, the bubble-like void aggregate was identified by the following method. About ten voids among those observed by using MO-6 were subjected to investigation of the shape thereof by using a transmission electron microscope (TEM). Here, the void aggregated from a plurality of smaller voids (it is confirmed that equal to or more than 40 voids are present in the void aggregate shown by the photo of FIG. 3) is defined as the bubble-like void aggregate. Ratio of the aggregate was determined from an observation result with TEM.

The above silicon wafer has, in addition to the above void configuration, two regions (V1 region and V2 region), having void density in a predetermined range, which is significantly smaller than that in the V region. Here, in the present description, the "V1 region" is defined as a region having the void density of over $2\times10^4/cm^3$ and below $1\times10^5/cm^3$, and the "V2 region" is defined as a region having the void density of $5\times10^2$ to $2\times10^4/cm^3$. Here, in the present description, the "void density" means number of voids with any kind of the shape, including bubble-like shape or the octahedron-like shape, per unit area. It should be noted that in the case of the bubble-like void aggregate, each void constituting the aggregate is measured as one void.

As shown in [E] of FIG. 1, the V1 region and the V2 region in the present embodiment are present between the V region 2 (narrower than the V region 2 of [A] to [D] of FIG. 1) and the OSF region. The V1 region and the V2 region (in particular, the V2 region), having significantly lower void density, as compared with the V region (over $1\times10^5/cm^3$), are considered a factor for providing a silicon crystal having significantly excellent voltage resistance characteristics of an oxidized film, and significantly high C-mode characteristics, in the present invention, as compared with a conventional one, together with the effect of having bubble-like void aggregates (10) in most of the voids present.

In the case where the above silicon wafer does not substantially contain hydrogen ([A], [B] and [D] of FIG. 1), in addition to the above void configuration, it becomes difficult to obtain high C-mode characteristics in a degree suitably applicable to the semiconductor device, in view of a void shape (octahedron) or the like, even when the void density can be made $\leq 2\times10^4/cm^3$.

On the other hand, in the silicon wafer relevant to the present embodiment, by doping of hydrogen in addition to nitrogen, and by carrying out the above "quenching" treatment, the void becomes mainly a bubble-like shape, and not a tetrahedron-like shape ((E) of FIG. 1), and still more the void density can be made significantly lower as compared with a conventional one. In the case where the void density is $\leq 2\times10^4/cm^3$ (equal to or lower than the upper limit value of the V2 region), in addition to the above void configuration, it results in little adverse influence on the oxidized film. As a result, the silicon crystal of the present embodiment provides excellent voltage resistance characteristics of an oxidized film, and significantly high C-mode characteristics.

In addition, there may be a region having a void density of $\geq 5\times10^2/cm^3$ (equal to or higher than the lower limit value of the V2 region), in addition to the above void configuration. Most parts of this region do not overlap with the OSF region present in a region having the void density below $5\times10^2/cm^3$. Therefore, high C-mode characteristics, in a degree suitably applicable to the semiconductor device relevant to the present embodiment, can be obtained. It should be noted that a region enclosed with a square in (E) of FIG. 1 represents a silicon wafer 11 relevant to the present embodiment. It is understood that, when (E) of FIG. 1 is observed, only a small part of both ends, in the silicon wafer 110, includes the OSF region.

Here, the V region, having a void density over $1\times10^5/cm^3$, has the high C-mode pass rate of 0%, but presence of such a region in a wafer, even in small amount, may make it difficult to produce a wafer having the high C-mode pass rate of equal to or higher than 70%, as a whole. On the other hand, because the V2 region having the void density of $2\times10^4$ to $5\times10^2/cm^3$ has a high C-mode pass rate of 70 to 100%, it becomes possible to produce a wafer having a high C-mode pass rate of 70%, with respect to the whole wafer, by setting all of the wafer surface to be the V2 region. The V1 region positioned between the V region and the V2 region has the high C-mode pass rate of 20 to 40%, but, as long as this region is present in a ratio of 20% relative to total area of the wafer, it becomes possible for attaining a high C-mode pass rate of equal to or higher than 70%, with respect to the whole wafer.

It is preferable that the void density is as small as possible in view of suppression of generation of grown-in defects, but the void density becomes $5\times10^2/cm^3$, when the lower limit value of V/G, to be described later, is specified at 0.7, in view of productivity.

The V2 region specified in this way occupies $\geq 80\%$ of the total area of the silicon wafer 11 relevant to the present embodiment. In such a case, the voltage resistance characteristic of the oxidized film becomes extremely good. In addition, the high C-mode pass rate (C-mode conforming rate) can be $\geq 70\%$. In the case where the high C-mode pass rate is $\geq 70\%$, such a silicon wafer can be used for devices such as DRAM or the like requiring less severe voltage resistance characteristics of the oxidized film, as compared with a flash memory. In addition, the V2 region preferably occupies $\geq 90\%$, and more preferably occupies 95 to 100%, of the total area of the silicon wafer 11.

On the other hand, the V1 region (a region having the void density of over $2\times10^4/cm^3$ and below $1\times10^5/cm^3$) occupies 20% of the total area of the silicon wafer 110. In such a case, voltage resistance characteristics of the oxidized film becomes increasingly good, as well as a high C-mode pass rate which surely becomes $\geq 70\%$.

In addition, the BMD density of the silicon wafer 110 relevant to the present embodiment is $\geq 5\times10^8/cm^3$, preferably, $\geq 1\times10^9/cm^3$, and more preferably $1\times10^9/cm^3$. It should be noted that the above BMD density means BMD density after heat treatment, and a BMD density within such a range can provide sufficient gettering capability.

The BMD density in the present description is measured as follows. First, heat treatment for oxygen deposition ("precipitation") (hereafter referred to also as "deposition heat treatment") is carried out on the silicon wafer 110 at 780° C. for 3 hours, subsequently at 1000° C. for 16 hours. Then, the silicon wafer 11 is cleaved to be subjected to measurement of the in-plane BMD of the silicon wafer 110, with a BMD analyzer MO-4, manufactured by Raytex Co. In-plane positions of measurement points were set from the center up to the edge 10 mm, in a 10 mm pitch. In this way, the value of the BMD density is determined.

A second embodiment of the present invention corresponds to a method for producing the silicon wafer of the above first embodiment. That is, nitrogen concentration in the silicon crystal is set to be $3\times10^{13}$ to $3\times10^{15}$ atoms/cm$^3$; pressure inside a crystal pulling furnace is set to be 40 to 250 mbar; 1 to 3.8% by volume of hydrogen is introduced into the furnace atmosphere; and the temperature gradient in a longitudinal direction of the above silicon crystal at 1100 to 1200° C. during pulling the silicon crystal is set to be $\geq 3.5°$ C./mm. Still more, the crystal pulling speed is controlled so that a V1 region having a void density of over $2\times10^4/cm^3$ and below $1\times10^5/cm^3$, becomes 20% of total area of the silicon wafer, as the upper limit value of crystal pulling speed. At the same time, crystal pulling speed is controlled so that a V2 region having a void density of $5\times10^2$ to $2\times10^4/cm^3$, becomes 80% of total area of the silicon wafer, as the lower limit value of crystal pulling speed. Control of the above pull-up speed is carried out by control of size (width) of the V1 region (the region having the void density of over $2\times10^4/cm^3$ and below $1\times10^5/cm^3$), the V2 region (the region having the void density of $5\times10^2$ to $2\times10^4/cm^3$) and the OSF region. It should be noted that the pulling furnace is not especially limited, as long as growth of a crystal in the present invention can be attained. Additional description will be given later on control of the pulling speed.

A method for producing the silicon wafer relevant to the present embodiment has technological significance in that nitrogen and hydrogen are added (doped) in predetermined concentration; in that the diameter of the silicon wafer and pressure inside the crystal pulling furnace are set to be predetermined values; in that quenching treatment is carried out during crystal pulling, under predetermined temperature gradient and pulling speed; and in that the void density is adjusted so as to be present within a predetermined range; as an integral body.

Explanation will be given below in detail on such technological significance. First, by constitution in the present embodiment (in particular, to add nitrogen and hydrogen in predetermined concentration, and to carry out "quenching"

treatment under predetermined temperature gradient and speed, as described above), the OSF region can be shrunk. As a result, some kinds of a micro defects, which may present in the OSF region, can be eliminated, and the void density can be decreased down to a range of $>1\times10^3/cm^3$ ands to $5\times10^3/cm^3$. In this way, a silicon wafer having excellent voltage resistance characteristics of an oxidized film, and high C-mode characteristics can be produced. In other words, with shrinkage of the OSF region, a low void density region, which never overlaps the OSF region, can appear over a wide range. In addition, most parts of the silicon wafer obtained by the production method relevant to the present embodiment, have a low void density region having only a trace amount of the shrunk OSF region (at the peripheral part of the silicon wafer 110 of (E) of FIG. 1).

Explanation will now be given on a single crystal production apparatus, which is capable of carrying out the above "quenching" treatment, with reference to FIG. 5, which is a schematic cross-sectional view showing a single crystal production apparatus useful in the present invention. The single crystal production apparatus shown in FIG. 5 has a member for melting a semiconductor material, or a mechanism for pulling-up a grown single crystal, and the member for melting the semiconductor material is accommodated inside a heating chamber 2a, and the mechanism for pulling-up the grown single crystal is installed at the inside and outside of a pulling-up chamber 2b constituting a part of an upper part structured body, which is designed to be separable from this heating chamber 2a. This upper part structured body has also a middle chamber 2c.

Inside the heating chamber 2a, a crucible for accommodating melt liquid L is installed, and this crucible is supported so as to be freely rotatable and freely descendable and ascendable with respect to a rotation axis 5, and the rotation axis 5 is rotated, and the crucible descended and ascended by a drive apparatus not shown. The drive apparatus ascends the crucible in relationship to a lowered height of the liquid surface, so as to compensate liquid surface reduction which accompanies pulling of a single crystal S, and in addition, always rotates the crucible in predetermined rotation rate to carry out stirring of the melt liquid L.

The crucible is a quartz crucible 3a, supported within a graphite crucible 3b. At the side wall part of the crucible, a heater 4 to melt silicon is arranged so as to surround the circumference thereof. At the outside of this heater 4, a heat insulator 12 is installed so as to surround the circumference, to prevent heat from the heater 4 to directly radiate onto the heating chamber 2a.

In the pulling chamber 2b, a pulling wire 8 is installed, wherein one end thereof is attached at a wire winding-up machine 11. The wire hangs down, penetrating through a top wall of a ceiling part of a middle chamber 2c, and a chuck 10 for holding a seed crystal 9 is attached at the lower end of this pull-up wire 8. The wire winding-up machine 11 pulls up the single crystal S, gradually growing at the lower end side of the seed crystal 9 according to growing speed thereof etc., and at the same time rotates, always in an opposite direction to the rotation direction of the crucible.

From a gas introduction entrance 13 formed at an accommodation part of the pulling-up chamber 2b, argon gas is introduced, and this argon gas is designed to be discharged from a gas discharge exit 14, after passing through inside of the heating chamber 2a. A reason for passing argon gas through the inside of the chamber in this way is not to mix in SiO gas or CO gas generated inside the chamber accompanying with melting of silicon by heating, into the silicon melt, as described above.

At the upward portion of the crucible in the chamber, a liquid cooling structure 21 and a cooling structure 22 are arranged so as to surround a growing single crystal. The liquid cooling structure 21 is a structure having liquid coolant passing through inside thereof. In FIG. 5, the liquid cooling structure 21 is constituted as a water cooling chamber made of stainless steel where water is used as a coolant.

The cooling structure 22 is composed of a high thermal conductivity material arranged so as to cool the growing single crystal S. A material of the cooling structure 22 may be selected from substances with high thermal conductivity and high heat radiation rate, for example, silver, silver alloys, carbon or copper and the like, but it is most preferable to use silver or silver alloys, as a material with high thermal conductivity, which also lower the risk of contamination of the melt liquid or the single crystal. A method for coating gold or silver or alloys thereof on the surface of copper or copper alloys may also be adopted.

In the liquid cooling structure 21, the cooling structure 22 is jointed, and the jointed part of the cooling structure 22 and the liquid cooling structure 21 constitutes an explosive bonded jointed part 25. In explosive bonding, materials themselves to be jointed are arranged in parallel at a suitable interval apart. By putting suitable amount of explosive on either of the materials via a buffering material and by initiating one end thereof with a detonator, both materials collide with progress of explosion, and at the explosion point, both metal materials show viscous fluid-like behavior by very large deformation speed and high pressure to generate metal jet flow from the explosion point to the forward. By this metal jet, the oxidized film or gas adsorption layer at the metal surface is removed, therefore a clean surface appeared adheres closely by high pressure, and both materials joint completely metallographically.

Since the jointed part between the cooling structure 22 and the liquid cooling structure 21 is jointed by explosive bonding, a good jointed part is formed in spite of a joint between different metals, and additionally nearly 100% of contact can be secured in the contact area. Therefore, heat conduction from the cooling body 22 to the liquid cooling structure 21 becomes extremely good, which enables decreased temperature of the cooling structure 22.

The cooling structure 22 is arranged at a position for shielding radiation heat from the crucible or the melt liquid L to the single crystal S, with a nearly rotational-symmetrical-shape with respect to the central axis of the growing single crystal S, and is jointed to the liquid cooling structured body 21 at the upper end part of the cooling body 22.

Figure 5:
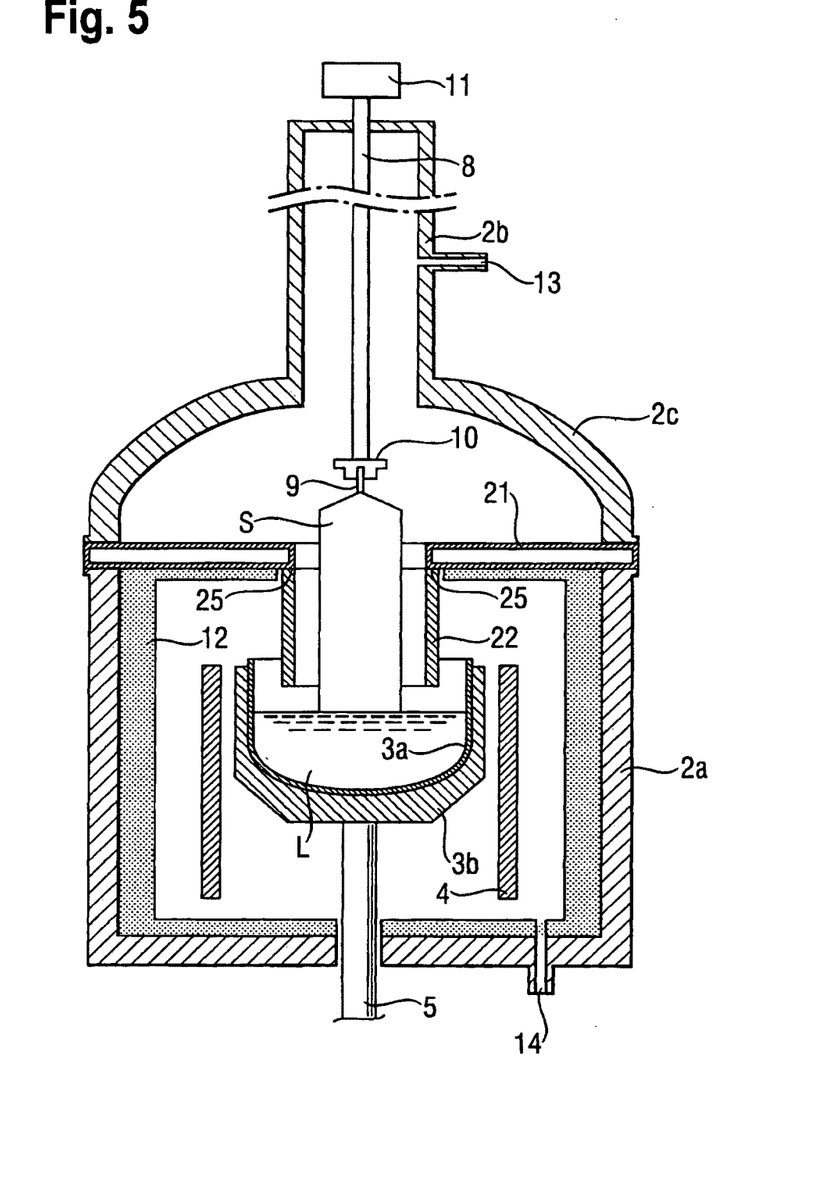
FIG. 5 is a schematic cross-sectional view showing an example of a single crystal production apparatus used in the present invention.

In FIG. 5, the cooling structure 22 is drawn in a cylindrical shape, and contact area of the explosive bonding jointed part 25 between the cooling structure 22 and the liquid cooling structured body 21 has nearly the same cross-sectional area of a main cooling structure.

The surface of the cooling structure 22 has the property of being capable of absorbing the incident heat radiation, by making the inside of the cooling structure 22 facing the single crystal S black. In addition, the outside of the cooling structure 22 facing the crucible or a heat shielding structure 26, may be a surface with high reflectance so as to reflect the incident heat radiation.

The liquid cooling structure 21 is a water cooling chamber of a doughnut-type shape, and is arranged between the middle chamber 2c and the heating chamber 2a.

In producing the single crystal S, the upper part structured body, having the pulling-up chamber 2b, the middle chamber 2c and the liquid cooling structured body 21, which is explosive bonded to the cooling structure 22, is separated from the heating chamber 2a, then polycrystalline silicon raw material and very trace amounts of impurities, which will become dopants, are charged into the crucible, and then the upper part structured body is attached at the heating chamber 2a again. In this state, the inside of the crucible is heated with the heater 4, until the semiconductor material in the crucible is melted. When the semiconductor material has reached a molten state, the pull-up wire 8 is descended by actuation of a wire winding machine 11, so that the seed crystal 9 attached at the chuck 10 is subjected to contacting with the surface of the melt liquid L. When the single crystal S starts to grow onto the seed crystal 9 in this state, then the wire winding up machine 11 is pulled-up at a predetermined speed to grow the single crystal S.

In this way, in the process for growing the single crystal S by pulling from the melt liquid L, thermal radiation from the single crystal S is absorbed by the cooling structure 22 composed of a material with high thermal conducting material. In this case, since the cooling structure 22 is explosive bonded to the liquid cooling structure 21, which is cooled with a liquid coolant and thus maintained at low temperature, radiation heat exchange with the single crystal S is good, and it becomes possible to increase the cooling rate of the single crystal S. At the same time, because it is possible to quench the single crystal S during pulling, generation of crystal defects in the single crystal S becomes extremely rare.

Subsequently, measurement of voltage resistance of the oxidized film (calculation of high C-mode pass rate) in the present description is carried out as follows. At the surface of a substrate (wafer) after heat treatment, the oxidized film with a thickness of 25 nm is formed under a dry oxygen atmosphere at 1000° C., and voltage resistance of the oxidized film is subjected measured. There are 164 electrodes used in measurement of voltage resistance at the wafer surface, and they are polysilicon electrodes with an area of 20 mm². Ratio of the electrodes, showing voltage resistance of a measurement current of 100 mA and an electric field intensity of $\geqq$ to 11 MV/cm, is defined as high C-mode pass rate, and the high C-mode pass rate of equal to or higher than 70% is judged "good" in relation to device performance.

Figure 6:
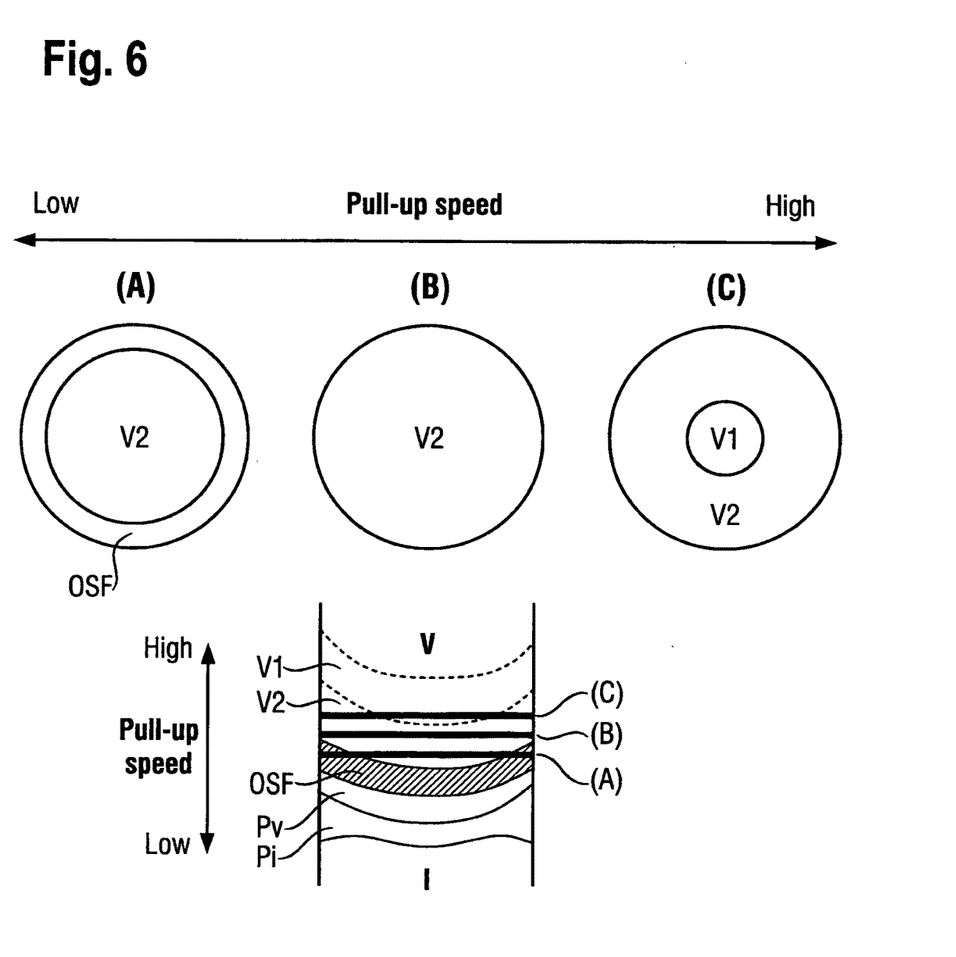
FIG. 6 is a drawing showing a relationship between pulling speed and a defect region of a silicon crystal.

FIG. 6 is a drawing showing the relationship between pull-up speed and a defect region of a silicon crystal. The lower drawing in FIG. 6 is a drawing (phase diagram) showing a cross-section of a crystal. Cross-sections at the points of (A), (B) and (C) in this drawing are shown in the upper drawing of FIG. 3. It has been found that any of the cross-sections at (A), (B) and (C) has an area of the V2 region of equal to or higher than 80%, however, a total area of the V1 region plus the OSF region is equal to or lower than 20%. That is, with the points of (A) and (C) as boundaries, the cross-section between them is always a region where the V1 region is 20% of the total area of the above silicon wafer which determines the upper limit of the crystal pulling speed, and the V2 region is 80% of the total area of the above silicon wafer which determines the lower limit of the crystal pulling speed. Therefore, an inside region with the points of (A) and (C) as both ends, is a desirable one in the silicon wafer obtained by the present embodiment.

Although the void density becomes significantly low, a considerable number of voids are still present, therefore this may lead to a decrease in voltage resistance characteristics of the oxidized film or C-mode. However, owing to constitution in the present embodiment (in particular, by the addition of nitrogen and hydrogen in predetermined concentration, and by "quenching" treatment at predetermined temperature gradient and pulling speed), the void becomes a bubble-like shape, and not a tetrahedron-like shape, as a result it can be rendered harmless to a considerable extent. The term "harmless" means that the void provides substantially no adverse influence on a device. Therefore, even if the void density is over $1 \times 10^3/cm^3$ and equal to or lower than $5 \times 10^3/cm^3$, a silicon wafer having excellent voltage resistance characteristics of an oxidized film and high C-mode characteristics can be produced. Still more, in such a case, because the pulling speed (V) is significantly increased, productivity may also be increased significantly. Explanation will be given below on each of the conditions (requirements). However, as for the conditions (requirements), which are duplicated with the above first embodiment, explanation is omitted here.

First, the diameter of the silicon crystal is not particularly limited, but it is preferable to be $\geqq 200$ mm. In the case where the diameter is $\geqq 200$ mm, the present invention becomes suitably applicable to the silicon crystal with a diameter of equal to or larger than 200 mm, which is used mainly in a device such as DRAM.

The present inventors have also examined the mutual relation between voids and in-plane OSF distribution in the silicon crystal, along with a high C-mode pass rate. The voids and in-plane OSF distribution in the silicon crystal are measured by using the above commercial defect evaluation apparatus, an LSTD scanner (MO-6) manufactured by Raytex Co. Since measurement conditions for MO-6 are as described above, explanation thereof is omitted here. From area density ($[/cm^2]$) of the void and OSF measured, and measurement depth, 5 μm, volume density ($[/cm^3]$) of the void was calculated. As an experimental system, (A) with nitrogen doping only (no hydrogen doping and "quenching" treatment of the present invention; (B) with nitrogen doping along with "quenching" treatment of the present invention (no hydrogen doping); along with (C) with nitrogen doping, hydrogen doping and "quenching" treatment of the present invention are included.

Figure 7:
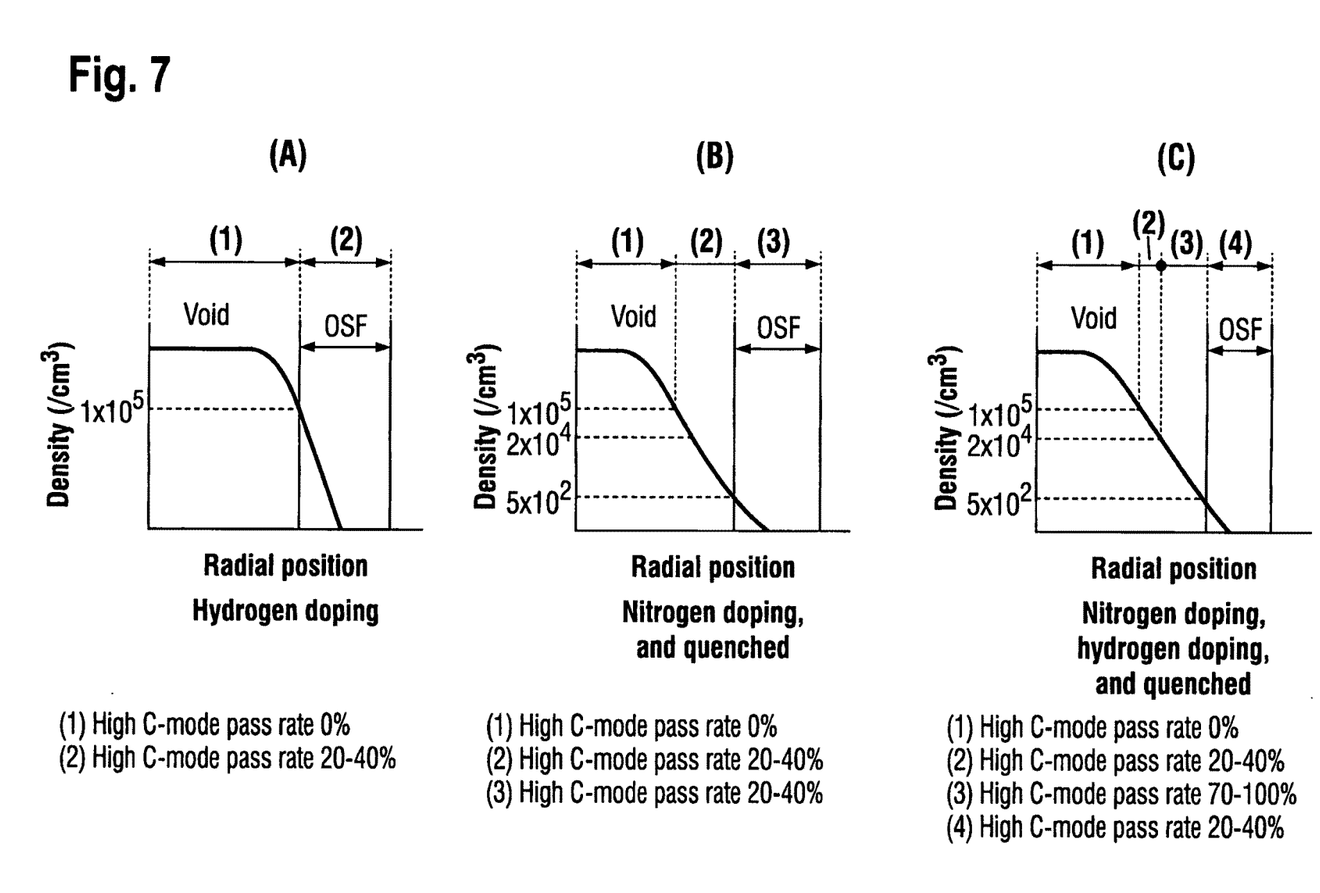
FIG. 7 is a graph showing investigation results on the relationship between in-plane distribution of voids and OSF in a silicon crystal, along with C-mode pass rate.

FIG. 7 shows examination results on relation between the voids and in-plane OSF distribution in the silicon crystal, along with C-mode pass rate. It should be noted that each condition in [A] to [C] of FIG. 7 is summarized in the following Table 2.

TABLE 2

|  | [A] | [B] | [C] |
| --- | --- | --- | --- |
| Nitrogen doping | Yes | Yes | Yes |
| Hydrogen doping | No | No | Yes |
| Quenching treatment | No | Yes | Yes |

From FIG. 7, in a region with the volume density ($[/cm^3]$) in a range of $5 \times 10^2$ to $2 \times 10^4/cm^3$, in the (C) system, good high C-mode pass rate (70 to 100%) was shown. It should be noted that other regions cannot be said to have good high C-mode pass rate, and it is only 20 to 40%.

Secondly, nitrogen concentration in the silicon crystal is set to be $3 \times 10^{13}$ to $3 \times 10^{15}$ atoms/cm³. The nitrogen concentration of $\geqq 3 \times 10^3$ atoms/cm³ enables a BMD density of $5 \times 10^8/cm^3$ (an essential range in the above first embodiment). The preferable lower limit value of the nitrogen concentration is $2 \times 10^{14}$ atoms/cm³, and in such a case, the BMD density of $1 \times 10^9/cm^3$ can be obtained (an essential range in the above first embodiment). On the other hand, in the case where the nitrogen concentration is $\leqq 3 \times 10^{15}$ atoms/cm³ and preferably $\leqq 2 \times 10^{15}$ atoms/cm³ provides, in most parts of the region of the resulting silicon wafer, a high C-mode pass rate (C-mode conforming rate) of $\geqq 80\%$, because of nearly no overlap of the OSF region and the V2 region. It should be noted that the nitrogen concentration in the silicon crystal and the nitrogen concentration in the resulting silicon wafer are substantially the same.

The pressure inside a crystal pulling furnace is set to be 40 to 250 mbar. In the case where the pressure (lower limit value) is ≧40 mbar, preferably ≧60 mbar, and more preferably ≧80 mbar, a decrease in product yield in pulling is effectively avoided. On the other hand, in the case of the above pressure (higher limit value) being ≦250 mbar, preferably ≦150 mbar, and more preferably ≦100 mbar a decrease in product yield in pulling is effectively avoided.

Then, 1 to 3.8% by volume of hydrogen is introduced into the atmosphere (high concentration hydrogen doping). A volume ratio of hydrogen introduced (lower limit value) ≧ than 1%, preferably ≧2.0%, and more preferably 3.0%, exerts sufficient effect of hydrogen introduction. On the other hand, a volume ratio of hydrogen (upper limit value) ≦than 3.8%, preferably ≦than 3.5%, and more preferably ≦3.0%, avoids risk of explosion.

The temperature gradient in a longitudinal direction of the silicon crystal at 1100 to 1200° C. in pulling the silicon crystal is set to be ≧3.5° C./mm. In the case where the above temperature gradient is ≧3.5° C./mm, by pulling at an increased temperature gradient up to a certain degree, and also by decreasing the pulling speed down to a certain degree, the above V2 region can appear over a wide range, between the void region and the OSF region. Appearance of such a V2 region is speculated to be caused by interaction of point defects in the temperature region of 1100 to 1200° C. The above temperature gradient is preferably 3.5 to 5.0° C./mm, more preferably 3.5 to 4.8° C./mm, and still more preferably 3.8 to 4.2° C./mm. In this way, by setting the temperature gradient within the above very limited range in the "quenching", the void density becomes significantly low, and the void aggregate becomes a bubble-like shape, resulting in nearly no adverse influence on the semiconductor device. In addition, it is suitable because a crystal can be pulled stably and easily at relatively low pulling speed. In particular, the case of setting the upper limit of the above temperature gradient at 5.0° C./mm is suitable, because crystal growth is stable, even at relatively low pulling speed.

Crystal pulling speed in the present embodiment is controlled by specifying ratio of the V1 region or the V2 region occupying total area of the silicon wafer. Specifically, the upper limit value of the crystal pulling speed is a value when the V1 region becomes 20% of the total area of the above silicon wafer. On the other hand, the lower limit value of the crystal pulling speed is a value when the V2 region becomes 80% of the total area of the above silicon wafer. In addition, as the above preferable ratio, the above upper limit value is a value when the V1 region becomes 0% of the total area of the above silicon wafer, and the above lower limit value is a value when the V2 region becomes 80% of the total area of the above silicon wafer. Still more preferably, the upper limit value is a value when the V1 region becomes 0% of the total area of the above silicon wafer, and the lower limit value is a value when the V2 region becomes 100% of the total area of the above silicon wafer. In this case, the whole surface of the wafer becomes the V2 region.

In more detail, control of crystal pulling speed, by such setting of the upper limit value and the lower limit value, is carried out by controlling a size (width) of the V1 region and the V2 region, along with the OSF region. Control of the size (width) of the V1 region and the V2 region is as described above. Control of the size (width) of the OSF region depends on the degree of shrinkage of the OSF region.

In addition, a range of the crystal pulling speed (V) in the present embodiment is 0.55 to 0.75 mm/minute, preferably 0.55 to 0.62 mm/minute, and more preferably 0.56 to 0.60 mm/minute. Each of these three ranges corresponds to a range, a preferable range and a more preferable range, respectively, in ratio of the V1 region or the V2 region occupying total area of the above silicon wafer. The crystal pulling speed equal to or lower than 0.75 mm/minute avoids a state such that the whole surface of the above silicon wafer becomes the V1 region, and enables generation of the V2 region, and therefore not only provides extremely good voltage resistance characteristics of the oxidized film but also the high C-mode pass rate (C-mode conforming rate) of equal to or higher than 70%. On the other hand, the crystal pull-up speed equal to or higher than 0.55 mm/minute avoids a state such that the whole surface of the above silicon wafer becomes the OSF region, and provide the high C-mode pass rate (C-mode conforming rate) of equal to or higher than 70%.

According to Voronkov theory (V. V. Voronkov; JOURNAL OF CRYSTAL GROWTH, 59 (1982) 625 to 643), a parameter V/G, which is ratio of the crystal pulling speed (V) and the average temperature gradient in a crystal growth longitudinal direction (G), determines type and total concentration of grown in microdefects (point defects). Here, G is defined as average temperature gradient in a crystal growth longitudinal direction from melting point to 1350° C. Therefore, because control of the crystal pulling speed in the present embodiment can be specified also by calculation of V/G, it will be explained below.

The relative V/G value is defined as follows. In a pulling furnace having the same structure as a pulling furnace for a crystal doped with the nitrogen and hydrogen, a crystal not doped with nitrogen and hydrogen was pulled at various pulling speeds V. Then, a wafer was cut out from the crystal to be subjected to precipitation heat treatment at 780° C. for 3 hours, and subsequently at 1000° C. for 16 hours, and then the BMD density was measured with a BMD analyzer. A region having a BMD density of equal to or higher than $1 \times 10^8/cm^3$ was defined as a V-rich region (the Pv region, the OSF region and the V region); a region having a BMD density of below $1 \times 10^8/cm^3$ was defined as an I-rich region (the Pi region, and the I region); and a boundary between the V-rich region and the I-rich region was defined as a V-I boundary. In this case, V/G value at the position in the V-I boundary corresponds to $(V/G)_{crit}$.

An absolute value of V/G cannot be determined unless the absolute value of G is known. However, by defining the relative V/G, where V/G is standardized by $(V/G)_{crit}$, it is considered that when the relative V/G is larger than 1, it becomes the V-rich region, while when the relative V/G is smaller than 1, it becomes the I-rich region. By examination of relation between the pulling speed and the V-I boundary position in advance, in-plane relative V/G value of a crystal pulling at a certain pulling speed, can be determined by using a pulling furnace with the same structure.

Figure 8:
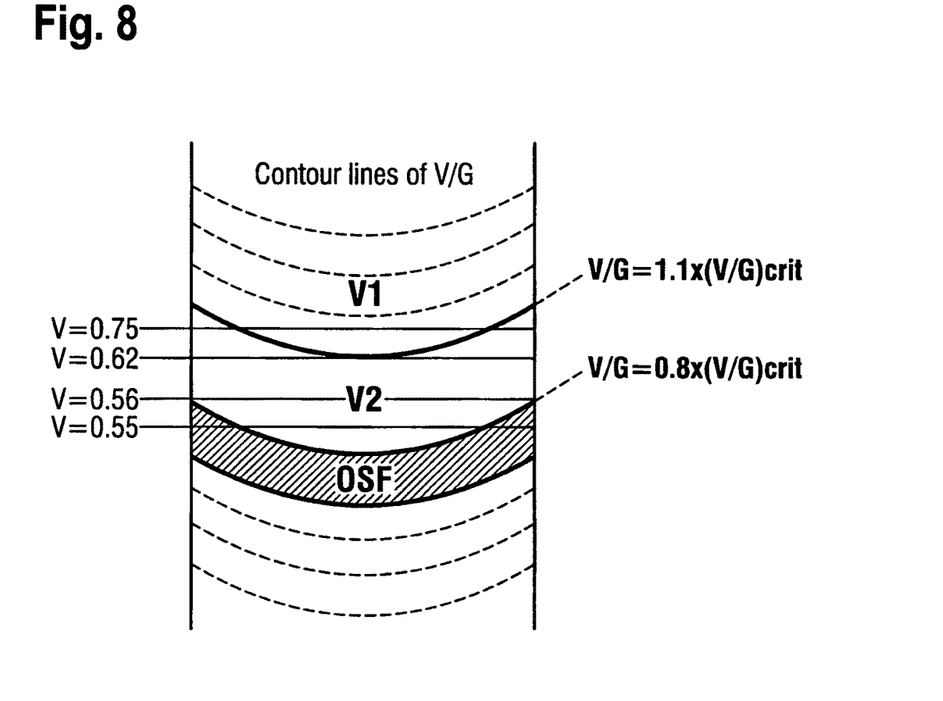
FIG. 8 is a drawing showing the relationship between the V1 region and the V2 region, and V/G and V in a silicon crystal.

A control method for the V1 region and the V2 region by V/G is as follows. In the present embodiment shown in (E) of FIG. 1, the V1 region appears where V/G is in a range of $\leq 1.1 \times (V/G)_{crit}$. In addition, the V2 region appears where V/G is in a range of $1.1 \times (V/G)_{crit}$ to $0.8 \times (V/G)_{crit}$. Therefore, in the present embodiment, a region where the V/G is in a range of $\geq 1.1 \times (V/G)_{crit}$ is ≦20% of the total area of the above silicon wafer, and the region where the V/G is $1.1 \times (V/G)_{crit}$ to $0.8 \times (V/G)_{crit}$ is ≧80% of the total area of the above silicon wafer. More preferably, in the whole surface of the above wafer, a region where the V/G is $\leq 1.1 \times (V/G)_{crit}$ and the V/G is $1.1 \times (V/G)_{crit}$ to $0.8 \times (V/G)_{crit}$, is ≧80% of the total area of the above silicon wafer. Still more preferably, in the whole surface of the above wafer, V/G is $1.1 \times (V/G)_{crit}$ to $0.8 \times (V/G)_{crit}$. Relation between the V1 region and the V2 region, and between the V/G and the V in the silicon crystal is shown in FIG. 8. It should be noted that FIG. 8 is a phase diagram.

In addition, as oxygen concentration in the silicon crystal according to the present invention, values calculated by using a conversion factor ($3.03 \times 10^{17}/cm^2$) of Japan Electronics and Information Technology Industries Association (JEITA) are used. Specifically, a standard measurement method of inter-lattice oxygen atom concentration in the silicon crystal by infrared absorption (former JEIDA-61) is used. It is preferable that the above oxygen concentration is set to be $\leq$ to $8.0 \times 10^{17}$ atoms/$cm^3$, more preferably $\leq$ to $7.0 \times 10^{17}$ atoms/$cm^3$, and still more preferably $5.0 \times 10^{17}$ to $7.0 \times 10^{17}$ atoms/$cm^3$. The case of the above oxygen concentration of $\leq 8.0 \times 10^{17}$ atoms/$cm^3$ enables suppression of a high C-mode non-conforming defect. In addition, in the case of the above oxygen concentration of $\geq$ to $5.0 \times 10^{17}$ atoms/$cm^3$ is preferable, because extreme decrease in yield in crystal pulling can be avoided. It should be noted that the oxygen concentration in the silicon crystal, and the oxygen concentration in the resulting silicon wafer are substantially the same. Oxygen is taken into the silicon melt by dissolving of the quartz crucible holding silicon melt liquid during the crystal pulling.

The silicon wafer (mirror surface wafer) is obtained by slicing the silicon crystal and polishing (mirror fabrication), if necessary. In this case, in order to obtain the BMD density in a degree required for gettering in a device process, heat treatment (precipitation heat treatment) for oxygen deposition may be carried out. Conditions of such heat treatment are not especially limited, as long as the desired BMD density can be obtained, but it is preferably 700 to 1000° C. for 1 to 30 hours. In addition, such a heat treatment may be carried out under constant treatment temperature or treatment time, or may be composed of two stages, where at least one of them is changed during the treatment. It should be noted that in the deposition heat treatment adopted as a measurement method for the BMD density in the above present description, two-stage heat treatment was carried out.

Explanation will be given below on Examples of the present invention. However, the present invention should not be limited to the following examples. That is, the following examples are only exemplifications, and any one, which has substantially the same constitution as technological concept described in the claims of the present invention and exerts similar action effect, should be included in technological scope of the present invention.

EXAMPLES

Example 1

Pulling of a silicon single crystal was carried out by using a silicon crystal production apparatus. The silicon crystal production apparatus used in the present example is a single crystal production apparatus having the cooling structure 22 shown in FIG. 5. Such an apparatus is used in producing a silicon crystal by the usual CZ method. In using the above apparatus, the crucible diameter was 22 inch, the semiconductor charge inserted into the crucible was 100 kg, and growing single crystal S was an 8 inch crystal.

As a material for the cooling structure 22, silver was used, and the cooling structure 22 had an inner diameter of 260 mm, an outer diameter of 300 mm, and a length of 280 mm. As the liquid cooling structure 21, a constitution of a doughnut-shaped water cooling chamber having a cooling water passage inside was used, and the liquid cooling structure 21 was attached at the lower part of the middle chamber 2c.

Specifically, the aforesaid production apparatus is a pulling furnace 1 or a pulling furnace 2, where the heat shielding body 26 was cooled by the above method to increase pulling speed to $\geq 1100°$ C., or a pulling furnace 3 having conventional pulling speed. In the furnace 1 and the furnace 2, a joint part of the cooling structure 22 and the liquid cooling structure 21 was jointed by explosive bonding. On the other hand, in the pulling furnace 3, the cooling structure 22 and the liquid cooling structure 21 was bolt-jointed.

The temperature gradient in a longitudinal direction of a crystal at 1100 to 1200° C. in pulling a crystal in the furnace 1 was set to be 4° C./mn, the temperature gradient in the furnace 2 was set to be 5° C./mm, and the temperature gradient in furnace 3, was set to be 3° C./mm. Kinds of the above furnaces (item "Furnace" in Table 3) and the temperature gradient in each of the Examples and Comparative Examples, are described in Table 3.

The conduction type of the silicon crystal grown by utilization of this apparatus was p-type (boron doping), and crystal size (diameter) was 200 mm (8 inch).

Nitrogen addition was carried out by charging a wafer having a nitride film into silicon melt liquid. Nitrogen concentration of a silicon wafer obtained by slicing a pulled crystal was measured by using a secondary ion mass spectroscope (SIMS). However, since a wafer having the nitrogen concentration of $5 \times 10^{14}$ atoms/$cm^3$ cannot be measured by using SIMS, the nitrogen concentration determined by the following numerical equation was used. Explanation will be given below in detail on such numerical equation.

The addition method for nitrogen in the production method relevant to the present invention is not especially limited, and a known method may be used; for example, a method for introducing nitrogen gas during dissolution of a silicon raw material; or a method for mixing a silicon substrate deposited with a nitride by a CVD method or the like during dissolution of the raw material; or the like is included. In addition, a segregation coefficient, k, which is ratio of the impurity taken into a crystal after solidification of silicon melt liquid to concentration in the melt liquid, was $7 \times 10^{-4}$, in the case of nitrogen (W. Zulehner and D. Huber, Crystal Growth, Properties and Applications, p 28, Springer-Verlag, New York, 1982).

Nitrogen concentration taken in a crystal from the silicon melt liquid, used in the production method of the present invention, can be calculated by:

Nitrogen concentration in a wafer=$k \times$(1−solidification rate)$^{(k-1)} \times$nitrogen concentration in the melt liquid.    Expression 1

It should be noted that nitrogen concentration in the melt liquid may be referred to as nitrogen concentration in initial melt liquid. Here, solidification rate (g) of the silicon crystal can be determined by:

Solidification rate ($g$) of the silicon crystal=(weight of crystallized silicon)/(weight of the initial melt liquid).    Expression 2

It should be noted that measurement value [atoms/$cm^3$] of nitrogen concentration is described in the following Table 3. As pressure inside the crystal pulling furnace (furnace pressure) [mbar], conditions described in Table 3 were set.

Hydrogen addition was carried out by introduction of hydrogen mixed gas into the furnaces. It should be noted that, as the hydrogen partial pressure [Pa] and volume ratio [% by volume] conditions described in Table 3 were set.

In addition, crystal pulling speed V and in-plane distribution of G were controlled as follows. First, as the upper limit value of the crystal pulling speed, the V1 region having a void density of over $2\times10^4/cm^3$ and below $1\times10^5/cm^3$ was controlled so as to be $\leqq 20\%$ of total area of the above silicon wafer. More specifically, in the above silicon wafer, in-plane distribution of G and pulling speed V were adjusted so that V/G at within 14 mm of the diameter is $\geqq 1.1\times(V/G)_{crit}$, and V/G at the whole surface of the above silicon wafer is $\geqq 0.8\times (V/G)_{crit}$. In this case, value of the crystal pulling speed, and in-plane V/G maximal value (V/G at the wafer center), and V/G minimal value (V/G at the wafer edge) of the above silicon wafer are as described in Table 3. It should be noted that V/G is represented by ratio to $(V/G)_{crit}$. In this way, by cutting out a plurality of substrates from the same position of this single crystal and subjecting them to mirror fabrication, silicon wafers (hereafter may also be referred to as "substrate") were obtained.

The V region of the substrate is a region formed by generation of voids, as a result of introduction of excess vacancies from a solid-liquid interface during crystal growth. Therefore, specifically, the V region of the substrate can be specified by the above void density.

Evaluation (identification) of the defect (void) region inside the substrate was carried out by the above method. In addition, as described above, volume density of the voids is calculated, to determine the V1 region and the V2 region. Inner diameter and outer diameter [cm] of the V1 region and the V2 region determined in this way, are described in the following Table 3.

OSF evaluation of the substrate was carried out by the following method. First, the substrate was subjected to an oxidation treatment under oxygen atmosphere containing steam at 1100° C. for 1 hour. After that, an oxidized film was removed with hydrofluoric acid, and then etched by a thickness of 1.5 µm, with light etching liquid, to observe ellipse-like, half moon-like or rod-like OSF pits generated at the surface, with an optical microscope. OSF area density [piece/$cm^2$] was determined as [OSF pits number/observation area] by counting OSF pits number by scanning a wafer in a diameter direction, in a view field of 2.5 mm diameter with an optical microscope. The OSF region was defined as a region having the OSF area density of equal to or higher than 100 pieces/$cm^2$. Inner diameter and outer diameter [cm] of the OSF region determined in this way, are described in the following Table 3.

As for each of oxygen concentration, ratio of the bubble-like void aggregate to the whole voids, the BMD density and the high C-mode pass rate (value of withstand voltage of the oxidized film), values measured by each of the above methods is described in Table 3.

Example 2

A silicon single crystal was pulled similarly as in Example 1, except that conditions of oxygen concentration, pulling speed, along with minimal value and maximal value of V/G were set as described in Table 3.

Example 3

A silicon single crystal was pulled similarly as in Example 1, except that conditions of oxygen concentration, pulling speed, along with minimal value and maximal value of V/G were set as described in Table 3.

Example 4

A silicon single crystal was pulled similarly as in Example 1, except that conditions of oxygen concentration, furnace pressure, and hydrogen partial pressure (hydrogen volume ratio) were set as described in Table 3.

Example 5

A silicon single crystal was pulled similarly as in Example 1, except that conditions of nitrogen concentration, oxygen concentration, pulling speed, along with minimal value and maximal value of V/G were set as described in Table 3.

Example 6

A silicon single crystal was pulled similarly as in Example 1, except that condition of nitrogen concentration was set as described in Table 3.

Example 7

A silicon single crystal was pulled similarly as in Example 1, except that conditions of oxygen concentration, pulling speed, minimal value and maximal value of V/G, kind of a pulling furnace, along with temperature gradient were set as described in Table 3.

Comparative Example 1

A silicon single crystal was pulled similarly as in Example 1, except that conditions of oxygen concentration, pulling speed, along with minimal value and maximal value of V/G were set as described in Table 3.

Comparative Example 2

A silicon single crystal was pulled similarly as in Comparative Example 1, except that conditions of nitrogen concentration, oxygen concentration, pulling speed, along with minimal value and maximal value of V/G were set as described in the following Table 3.

Comparative Example 3

A silicon single crystal was pulled similarly as in Comparative Example 1, except that conditions of nitrogen concentration, oxygen concentration, pulling speed, along with minimal value and maximal value of V/G were set as described in Table 3.

Comparative Example 4

A silicon single crystal was pulled similarly as in Comparative Example 1, except that conditions of oxygen concentration, pulling speed, minimal value and maximal value of V/G, along with hydrogen volume ratio were set as described in Table 3.

Comparative Example 5

A silicon single crystal was pulled similarly as in Comparative Example 1, except that conditions of oxygen concentration, pulling speed, minimal value and maximal value of V/G, along with furnace pressure were set as described in Table 3.

Comparative Example 6

A silicon single crystal was pulled similarly as in Comparative Example 1, except that conditions of oxygen concentration, pulling speed, minimal value and maximal value of V/G, along with furnace pressure were set as described in Table 3.

Comparative Example 7

A silicon single crystal was pulled similarly as in Comparative Example 1, except that conditions of oxygen concentration, pulling speed, minimal value and maximal value of V/G, kind of a pulling furnace, along with temperature gradient were set as described in Table 3.

Comparative Example 8

A silicon single crystal was pulled similarly as in Comparative Example 1, except that conditions of nitrogen concentration, oxygen concentration, pulling speed, along with minimal value and maximal value of V/G were set as described in Table 3.

Results of the above Examples and Comparative Examples are shown in Table 3.

TABLE 3

| Classification | Nitrogen conc. [atoms/cm3] | Oxygen conc. [atoms/cm3] | Pulling speed [mm/min] | V/G minimal value Ratio to ratio (V/G)crit | V/G maximal value | Furnace | Temp. gradient [C/mm] | Furnace pressure [mbar] |
|---|---|---|---|---|---|---|---|---|
| Example 1 | 2.0E+14 | 6.8E+17 | 0.64 | 0.90 | 1.11 | 1 | 4 | 40 |
| Example 2 | 2.0E+14 | 6.9E+17 | 0.57 | 0.81 | 0.99 | 1 | 4 | 40 |
| Example 3 | 2.0E+14 | 6.6E+17 | 0.55 | 0.78 | 0.95 | 1 | 4 | 40 |
| Example 4 | 2.0E+14 | 6.9E+17 | 0.64 | 0.90 | 1.11 | 1 | 4 | 250 |
| Example 5 | 1.0E+15 | 6.7E+17 | 0.55 | 0.78 | 0.95 | 1 | 4 | 40 |
| Example 6 | 4.0E+13 | 6.8E+17 | 0.64 | 0.90 | 1.11 | 1 | 4 | 40 |
| Example 7 | 2.0E+14 | 6.9E+17 | 0.55 | 0.78 | 0.95 | 2 | 5 | 40 |
| Com. Exp. 1 | 2.0E+14 | 6.2E+17 | 0.46 | 0.65 | 0.80 | 1 | 4 | 40 |
| Com. Exp. 2 | 3.0E+14 | 6.8E+17 | 0.85 | 1.20 | 1.47 | 1 | 4 | 40 |
| Com. Exp. 3 | 3.0E+14 | 6.7E+17 | 0.50 | 0.71 | 0.87 | 1 | 4 | 40 |
| Com. Exp. 4 | 2.0E+14 | 6.9E+17 | 0.64 | 0.90 | 1.11 | 1 | 4 | 40 |
| Com. Exp. 5 | 2.0E+14 | 6.9E+17 | 0.64 | 0.90 | 1.11 | 1 | 4 | 30 |
| Com. Exp. 6 | 2.0E+14 | 6.9E+17 | 0.64 | 0.90 | 1.11 | 1 | 4 | 300 |
| Com. Exp. 7 | 2.0E+14 | 6.9E+17 | 0.55 | 0.78 | 0.95 | 3 | 3 | 40 |
| Com. Exp. 8 | 4.0E+15 | 6.7E+17 | 0.64 | 0.90 | 1.11 | 1 | 4 | 40 |

| Classification | Hydrogen volume ratio [%] | Hydrogen partial pressure [Pa] | Bubble-like void ratio [%] | V1 region inner-outer diameter [mm] | V2 region inner-outer diameter [mm] | OSF region inner-outer diameter [mm] | BMD minimal value | High C-mode [/cm3] rate [%] |
|---|---|---|---|---|---|---|---|---|
| Example 1 | 2 | 80 | 90 | 0-14 | 14-100 | — | 1.1E+09 | 73 |
| Example 2 | 2 | 80 | 80 | — | 0-100 | — | 1.3E+09 | 90 |
| Example 3 | 2 | 80 | 70 | — | 0-90 | 90-100 | 1.3E+09 | 85 |
| Example 4 | 3.8 | 950 | 100 | 0-14 | 14-100 | — | 3.2E+09 | 75 |
| Example 5 | 2 | 80 | 80 | — | 0-92 | 92-100 | 4.8E+09 | 87 |
| Example 6 | 2 | 80 | 70 | 0-13 | 13-100 | — | 6.8E+08 | 71 |
| Example 7 | 2 | 80 | 90 | — | 0-92 | 92-100 | 1.7E+09 | 82 |
| Com. Exp. 1 | 2 | 80 | 80 | — | — | 0-100 | 1.2E+09 | 25 |
| Com. Exp. 2 | 2 | 80 | 70 | 0-100 | — | — | 1.3E+09 | 32 |
| Com. Exp. 3 | 2 | 80 | 80 | — | 0-70 | 70-100 | 1.5E+09 | 63 |
| Com. Exp. 4 | 0.5 | 20 | 20 | 0-14 | 14-100 | — | 1.2E+09 | 21 |

TABLE 3-continued

| | | | | | | | | |
|---|---|---|---|---|---|---|---|---|
| Com. Exp. 5 | 2 | 60 | | | Take-up impossible | | | |
| Com. Exp. 6 | 2 | 600 | | | Take-up impossible | | | |
| Com. Exp. 7 | 2 | 80 | 80 | 0-90 | — | 90-100 | 2.1E+09 | 12 |
| Com. Exp. 8 | 2 | 80 | 80 | — | — | 0-100 | 3.4E+09 | 31 |

From Table 3, the high C-mode of any of the silicon wafers obtained in Examples 1 to 7 showed excellent results of over 70%. Therefore, the silicon crystal obtained in any of these Examples can be said to be applicable to any device including a device such as DRAM. Still more, where the pulling speed is below 0.60 and V/G minimal value is below 0.9 and V/G maximal value is below 1.0 among Examples 1 to 7, the high C-mode of the silicon wafer showed a still more excellent result of over 80%.

It should be noted that, as an examination of stability of crystal pulling speed among Examples 1 to 7, it was found that, as compared with Example 7, Examples 1 to 6 showed significantly more stable crystal pulling speed. Such a result is considered to show that conditions of the pulling speed and temperature gradient set in Examples 1 to 6 are extremely suitable for stability of the crystal pulling speed.

On the other hand, in each of Comparative Examples, the high C-mode was below 70%, or crystal pulling was impossible. Therefore, the silicon crystals obtained in any of these Comparative Examples can be said not to be suitable to any device, including a low grade device. Reasons for obtaining such poor results in each of the Comparative Examples are discussed as follows: Comparative Example 1 was not able to eliminate certain kinds of micro defects which may present in the OSF region, because the whole surface of the wafer was the OSF region; Comparative Example 2 did not generate the V2 region with extremely low void density, because the whole surface of the wafer was the V1 region; in Comparative Example 3, the area ratio of the V2 region, in total area of the above silicon wafer, does not significantly satisfy 80%, although the above V2 region was generated; Comparative Example 4 did not form nearly the bubble-like void aggregate, because hydrogen volume ratio was extremely insufficient; Comparative Example 5 was not able to even pull a crystal because furnace pressure was significantly low; Comparative Example 6 was not able to even pull a crystal also, because furnace pressure was significantly high, adversely in Comparative Example 5; Comparative Example 7 was insufficient in "cooling" treatment specific to the present invention; and Comparative Example 8 has high nitrogen concentration, and similarly as in Comparative Example 1, was not able to eliminate certain kind of the microdefects which may present in the OSF region, because the whole surface of the wafer was the OSF region.

The present invention is suitably applicable, in particular, in a micro semiconductor device.

DESCRIPTION OF REFERENCE NUMERALS

110: silicon wafer
2a: heating chamber
2b: pulling-up chamber
2c: middle chamber
3a: quartz crucible
3b: graphite crucible
4: heating heater
5: rotation axis
8: pulling wire
9: seed crystal
10: chuck
11: wire winding machine
12: heat insulator
13: gas introduction entrance
14: gas discharge exit
21: liquid cooling structured body
22: cooling body
25: explosive bonding jointed part
L: melt liquid
S: single crystal While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A silicon wafer doped with nitrogen and hydrogen, comprising:
   a plurality of voids constituting bubble-like void aggregates which are present in an amount $\geqq$ to 50% of total void number;
   a V1 region having a void density of over $2\times10^4/cm^3$ and below $1\times10^5/cm^3$ which occupies $\leqq$ to 20% of the total area of the silicon wafer;
   a V2 region having a void density of $5\times10^2$ to $2\times10^4/cm^3$ which occupies to 80% of the total area of the silicon wafer; and
   a bulk micro defect density $\geqq 5\times10^8/cm^3$.

2. A method for producing a silicon wafer of claim 1, comprising obtaining a silicon wafer from a silicon crystal pulled by a method comprising:
   setting a nitrogen concentration in the silicon crystal from $3\times10^{13}$ to $3\times10^{15}$ atoms/cm$^3$;
   setting a pressure of the atmosphere inside a crystal pulling furnace from 40 to 250 mbar;
   introducing hydrogen in an amount of 1 to 3.8% by volume into the atmosphere;
   establishing a temperature gradient in a longitudinal direction of the silicon crystal over the range of 1100° to 1200° C. during pulling of the silicon crystal to $\geqq$ to 3.5° C./mm; and
   controlling an upper limit of pulling speed such that a V1 region having a void density of over $2\times10^4/cm^3$ and below $1\times10^5/cm^3$ is $\leqq 20\%$ of the total area of the silicon wafer, and controlling a lower limit of pulling speed such that a V2 region having a void density of $5\times10^2$ to $2\times10^4/cm^3 \geqq 80\%$ of the total area of said silicon wafer.

3. The method of claim 2, wherein the oxygen concentration in the silicon crystal is set to be $\leqq$ to $7\times10^{17}$ atoms/cm$^3$.

* * * * *